(12) United States Patent
Moronaga et al.

(10) Patent No.: US 9,763,288 B2
(45) Date of Patent: Sep. 12, 2017

(54) EL PANEL, AND ILLUMINATION DEVICE AND DISPLAY DEVICE USING THE SAME

(71) Applicant: TOPPAN PRINTING CO., LTD., Tokyo (JP)

(72) Inventors: Kohhei Moronaga, Tokyo (JP); Hideaki Homma, Tokyo (JP); Akihito Kagotani, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 14/794,196

(22) Filed: Jul. 8, 2015

(65) Prior Publication Data

US 2015/0312973 A1    Oct. 29, 2015

Related U.S. Application Data

(63) Continuation of application No. 13/262,100, filed as application No. PCT/JP2010/055164 on Mar. 25, 2010, now Pat. No. 9,112,185.

(30) Foreign Application Priority Data

Mar. 31, 2009   (JP) ................................ 2009-085371

(51) Int. Cl.
*G02B 5/04*    (2006.01)
*H05B 33/04*    (2006.01)
(Continued)

(52) U.S. Cl.
CPC .............. *H05B 33/04* (2013.01); *G02B 5/045* (2013.01); *G02B 27/0961* (2013.01);
(Continued)

(58) Field of Classification Search
CPC ........ H05B 33/04; H05B 33/10; H05B 33/12; G02B 5/045; G02B 27/0961;
(Continued)

(56) References Cited

U.S. PATENT DOCUMENTS 6,890,642 B2 *   5/2005   Kaminsky ............ G02B 5/0221
                                                359/599
6,900,941 B2 *   5/2005   Kaminsky ............ G02B 5/0221
                                                359/599
(Continued)

FOREIGN PATENT DOCUMENTS

JP      2002-260845      9/2002
JP      2004-205849      7/2004
(Continued)

OTHER PUBLICATIONS

International Search Report for PCT/JP2010/055164 dated Jun. 29, 2010.
(Continued)

*Primary Examiner* — Elmito Breval
*Assistant Examiner* — Fatima Farokhrooz
(74) *Attorney, Agent, or Firm* — Staas & Halsey LLP

(57) ABSTRACT

An EL panel including: a light-transmissive substrate; an EL element including a light-emitting medium layer interposed between a cathode and an anode, the EL element being provided on one surface of the light-transmissive substrate; and a protection sheet on the other surface of the light-transmissive substrate of the EL element. The protection sheet has a surface opposite to the light-transmissive substrate, the shape of the surface includes rounded convex shapes and prism shapes. Each of the rounded shapes has an apex that is a center point of a cross-section farthest from a bottom surface where the cross-section is parallel to the bottom surface of the unit convex shape and the area becomes smaller in a direction from the bottom surface of the rounded convex shape to a top portion thereof.

8 Claims, 17 Drawing Sheets

(51) Int. Cl.
*G02B 27/09* (2006.01)
*H01L 51/52* (2006.01)
*H05B 33/10* (2006.01)
*H05B 33/12* (2006.01)
*H01L 27/32* (2006.01)

(52) U.S. Cl.
CPC ........ *H01L 51/529* (2013.01); *H01L 51/5262* (2013.01); *H05B 33/10* (2013.01); *H05B 33/12* (2013.01); *H01L 27/3239* (2013.01); *H01L 51/5275* (2013.01)

(58) Field of Classification Search
CPC ............... H01L 51/5262; H01L 51/529; H01L 27/3239; H01L 51/5275
See application file for complete search history.

(56) References Cited

U.S. PATENT DOCUMENTS

| | | | |
|---|---|---|---|
| 7,271,862 B2 * | 9/2007 | Matsunaga | G02B 5/0278 349/112 |
| 2005/0243575 A1 | 11/2005 | Kunimochi | |
| 2006/0049749 A1 | 3/2006 | Ishikawa et al. | |
| 2006/0146571 A1 | 7/2006 | Whitney | |
| 2008/0055936 A1 | 3/2008 | Wilson et al. | |
| 2009/0052045 A1 | 2/2009 | Coyle et al. | |
| 2009/0122577 A1 * | 5/2009 | Wu | G02B 5/0215 362/627 |
| 2009/0214828 A1 | 8/2009 | Watkins et al. | |
| 2010/0066942 A1 | 3/2010 | Teragawa | |
| 2010/0085735 A1 | 4/2010 | Kim et al. | |

FOREIGN PATENT DOCUMENTS

| | | |
|---|---|---|
| JP | 2005-317435 | 11/2005 |
| JP | 2006-030872 | 2/2006 |
| JP | 2006-100257 | 4/2006 |
| JP | 2008-027689 | 2/2008 |
| KR | 2006078410 A | 7/2006 |
| WO | 2008/056473 A1 | 5/2008 |
| WO | 2009/022862 A1 | 2/2009 |

OTHER PUBLICATIONS

Office Action issued by the State Intellectual Property Office of the P.R. China dated Oct. 25, 2013 in the corresponding Chinese patent application No. 2010800151001.
European Search Report dated Apr. 28, 2014 in corresponding European Patent Application No. 10758511.9.
Office Action dated Sep. 18, 2012 in related U.S. Appl. No. 13/262,100.
Office Action dated Jun. 12, 2013 in related U.S. Appl. No. 13/262,100.
Office Action dated Dec. 6, 2013 in related U.S. Appl. No. 13/262,100.
Advisory Action dated Feb. 21, 2014 in related U.S. Appl. No. 13/262,100.
Office Action dated Apr. 2, 2014 in related U.S. Appl. No. 13/262,100.
Office Action dated Sep. 17, 2014 in related U.S. Appl. No. 13/262,100.
Notice of Allowance dated Apr. 14, 2015 in related U.S. Appl. No. 13/262,100.
U.S. Appl. No. 13/262,100, filed Sep. 29, 2011, Kohhei Moronaga et al., Toppan Printing Co., Ltd.

* cited by examiner

100

FIG. 11
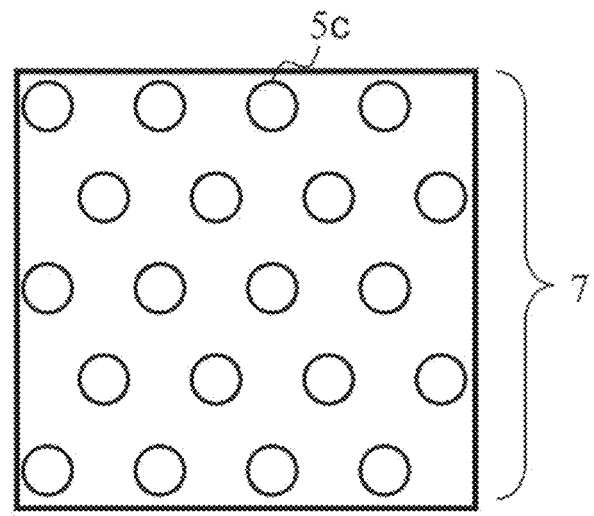
(a)
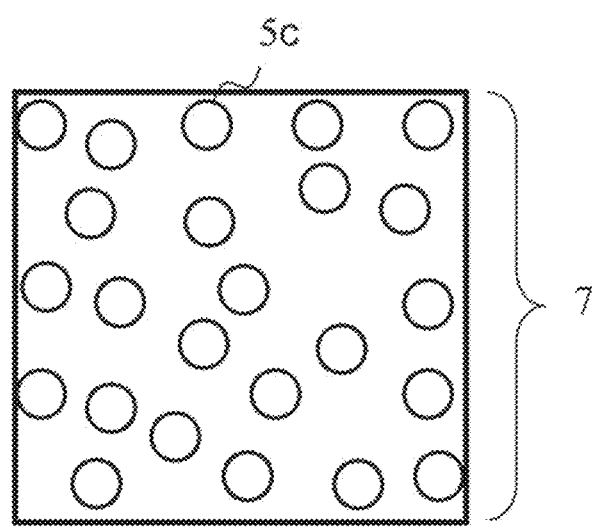
(b)

FIG. 13
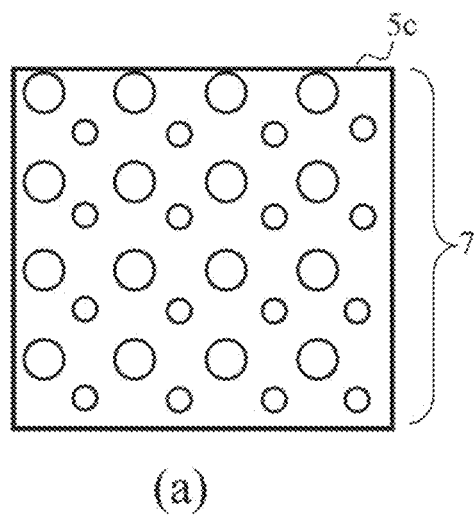
(a)
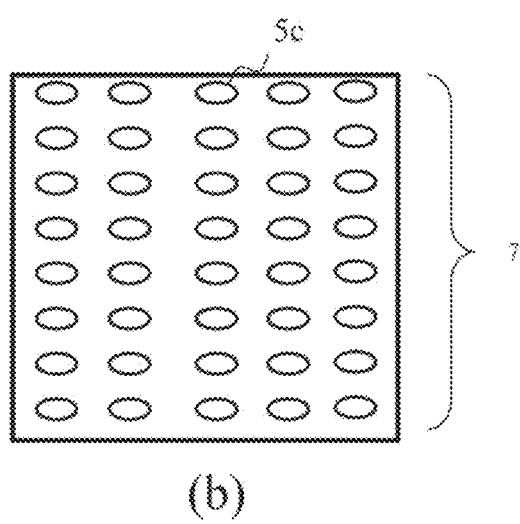
(b)
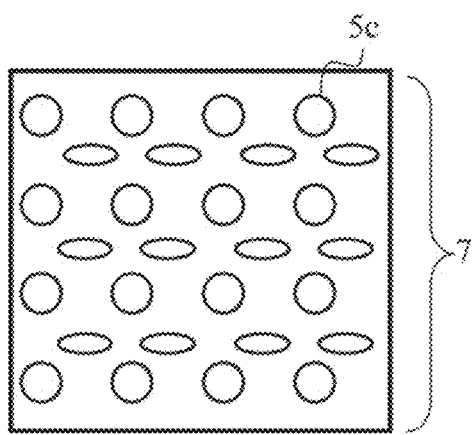
(c)
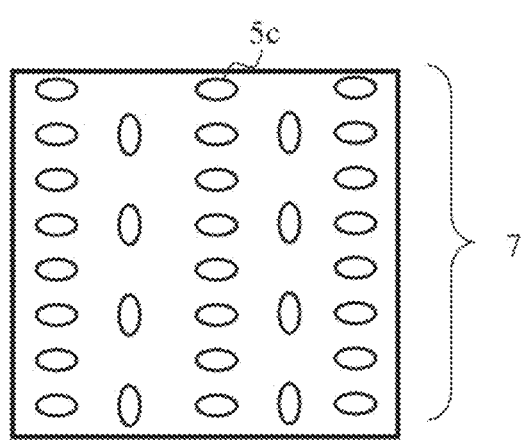
(d)

FIG. 14
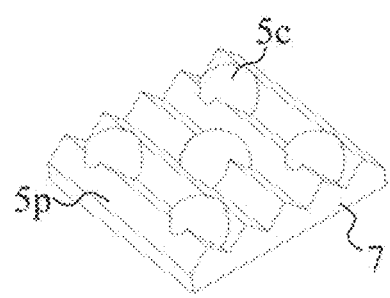
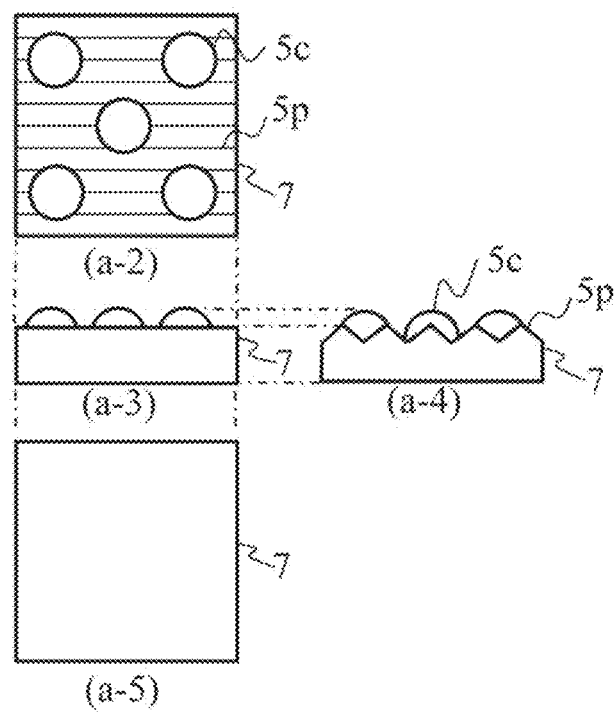
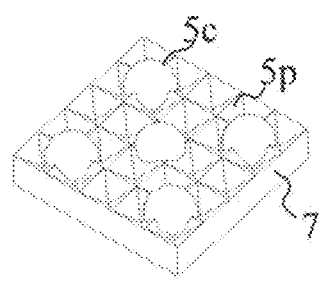
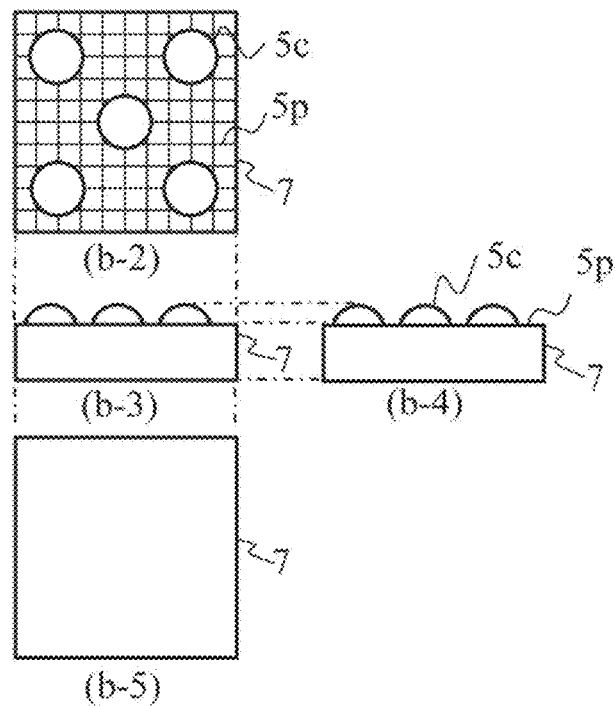

FIG. 16

TABLE 1

| HEIGHT OF PRISM SHAPE (μm) | HEIGHT OF ROUNDISH CONVEX SHAPE (μm) | DISTANCE BETWEEN ROUNDISH CONVEX-SHAPED AREAS (μm) | DARK PART | FINGER MARK |
|---|---|---|---|---|
| 4 | 53 | 80 | | YES |
| 7 | 53 | 80 | | YES |
| 8 | 53 | 80 | | YES |
| 9 | 53 | 80 | | YES |
| 10 | 53 | 80 | | YES |
| 13 | 53 | 80 | | NO |
| 15 | 53 | 80 | | NO |
| 17 | 53 | 80 | | NO |
| 19 | 53 | 80 | | NO |
| 20 | 53 | 80 | | NO |
| 25 | 53 | 80 | | YES |
| 30 | 53 | 80 | | YES |
| 35 | 53 | 80 | | YES |
| 46 | 53 | 80 | | YES |
| 51 | 53 | 80 | | YES |
| 63 | 53 | 80 | | YES |
| 71 | 53 | 80 | | YES |
| 82 | 53 | 80 | | YES |

TABLE 2

| HEIGHT OF PRISM SHAPE (μm) | HEIGHT OF ROUNDISH CONVEX SHAPE (μm) | DISTANCE BETWEEN ROUNDISH CONVEX-SHAPED AREAS (μm) | DARK PART | FINGER MARK |
|---|---|---|---|---|
| 4 | 71 | 130 | | YES |
| 5 | 71 | 130 | | YES |
| 6 | 71 | 130 | | YES |
| 7 | 71 | 130 | | NO |
| 10 | 71 | 130 | | NO |
| 13 | 71 | 130 | | NO |
| 17 | 71 | 130 | | NO |
| 19 | 71 | 130 | | NO |
| 20 | 71 | 130 | | NO |
| 25 | 71 | 130 | | NO |
| 30 | 71 | 130 | | NO |
| 35 | 71 | 130 | | NO |
| 40 | 71 | 130 | | NO |
| 46 | 71 | 130 | | NO |
| 51 | 71 | 130 | | YES |
| 63 | 71 | 130 | | YES |
| 71 | 71 | 130 | | YES |
| 82 | 71 | 130 | | YES |

TABLE 3

| HEIGHT OF PRISM SHAPE (μm) | HEIGHT OF ROUNDISH CONVEX SHAPE (μm) | DISTANCE BETWEEN ROUNDISH CONVEX-SHAPED AREAS (μm) | DARK PART | FINGER MARK |
|---|---|---|---|---|
| 4 | 112 | 184 | | YES |
| 7 | 112 | 184 | | YES |
| 8 | 112 | 184 | | YES |
| 11 | 112 | 184 | | YES |
| 13 | 112 | 184 | | YES |
| 16 | 112 | 184 | | NO |
| 21 | 112 | 184 | | NO |
| 25 | 112 | 193 | | NO |
| 29 | 112 | 184 | | NO |
| 31 | 112 | 184 | | NO |
| 42 | 112 | 184 | | NO |
| 53 | 112 | 184 | | NO |
| 61 | 112 | 184 | | NO |
| 75 | 112 | 184 | | YES |
| 83 | 112 | 184 | | YES |
| 104 | 112 | 184 | | YES |
| 115 | 112 | 184 | | YES |
| 133 | 112 | 184 | | YES |
| 155 | 112 | 184 | | YES |
| 165 | 112 | 194 | | YES |

TABLE 4

| HEIGHT OF PRISM SHAPE (μm) | HEIGHT OF ROUNDISH CONVEX SHAPE (μm) | DISTANCE BETWEEN ROUNDISH CONVEX-SHAPED AREAS (μm) | DARK PART | FINGER MARK |
|---|---|---|---|---|
| 4 | 152 | 271 | | YES |
| 7 | 152 | 271 | | YES |
| 8 | 152 | 271 | | YES |
| 11 | 152 | 271 | | YES |
| 13 | 152 | 271 | | YES |
| 16 | 152 | 271 | | YES |
| 21 | 152 | 271 | | NO |
| 25 | 152 | 271 | | NO |
| 29 | 152 | 271 | | NO |
| 31 | 152 | 271 | | NO |
| 42 | 152 | 271 | | NO |
| 53 | 152 | 271 | | NO |
| 61 | 152 | 271 | | NO |
| 75 | 152 | 271 | | NO |
| 83 | 152 | 271 | | NO |
| 104 | 152 | 271 | | YES |
| 115 | 152 | 271 | | YES |
| 133 | 152 | 271 | | YES |
| 155 | 152 | 271 | | YES |
| 165 | 152 | 271 | | YES |

EL PANEL, AND ILLUMINATION DEVICE AND DISPLAY DEVICE USING THE SAME

CROSS-REFERENCE TO RELATED APPLICATION

This is a continuation of prior U.S. application Ser. No. 13/262,100, filed Sep. 29, 2011, now pending, which is the U.S. National Phase Application under 35 U.S.C. §371 of International Patent Application No. PCT/JP2010/055164 filed Mar. 25, 2010, which designated the United States and was published in a language other than English, which claims the benefit of Japanese Patent Application No. 2009-085371, filed Mar. 31, 2009, both of them are incorporated by reference herein. The International Application was published in Japanese on Oct. 7, 2010 as WO2010/113738 A1 under PCT Article 21(2).

BACKGROUND OF THE INVENTION

Field of the Invention

The present invention relates to an EL panel (electroluminescent device) used in illumination devices, decorative illuminations, light sources for signs, and the like, and a display device using the EL panel.

Background Art

Generally, an EL element has a structure in which a hole injection layer, a hole transport layer, an interlayer layer, a light-emitting layer, an electron transport layer, and an electron injection layer are interposed between an anode and a cathode on a light-transmissive substrate.

An exciton is formed by applying a DC voltage to the anode and the cathode of the above-described structure, and then by injecting electrons and holes to the light-emitting layer for re-coupling, and light is emitted by discharging light when the exciton is in deactivation.

Conventionally, when a light beam exiting from a light-emitting layer has been emitted from a light-transmissive substrate of the light-emitting face side in such an EL element, part of the light beam has been totally reflected on the surface of the light-transmissive substrate of an observance side, and accordingly, a problem has occurred in that the amount of light to be extracted to the outside is lost.

It is believed that the light extraction efficiency of this case is generally approximately 20%.

For this reason, there is a problem in that as the demand for display or illumination with high luminance becomes greater, it is necessary to increase the amount of input power.

In addition, in this case, since a large amount of current flows in the device, a burden on the device increases, resulting in a reduction in luminance and shortened product life, and thereby the reliability of the device deteriorates.

Thus, for the purpose of enhancing the light extraction efficiency of light exiting from an EL element, an EL panel has been proposed which extracts light rays, which would be totally reflected by the surface of the light-transmissive substrate and become light loss, to the outside by forming fine unevenness on the surface of an observer side of the light-transmissive substrate of the light-emitting face side.

In order to enhance the light extraction efficiency as described above, for example, a micro-lens array 24 can be used, in which a plurality of micro-lens elements are arranged in a flat manner on one surface of a light-transmissive substrate 20 proposed in Japanese Unexamined Patent Application, First Publication No. 2002-260845, as shown in FIG. 17.

However, when the above-described micro-lens array 24 is used in an EL element, when a heat transfer body such as a finger is in contact with the micro-lens array 24, the EL element becomes dark at the contact point, whereby irregular luminance is shown in a bright area and a dark area in the in-plane of the EL element.

Since the area contacted by the heat transfer body continues to be dark for approximately several minutes to dozens of minutes, a shadow of illumination such as a standing light or a wall-mounted illumination is generated, which hinders practical observation of a light-illuminated object.

In the above-described conventional technique, when a heat transfer body such as a finger or the like is in contact with the surface of the EL element, heat on the contact part of the EL element is lost, changing the light emission efficiency of the EL element, whereby the part becomes dark.

Accordingly, there are a part where the finger is in contact with (dark part) and a part where the finger does not contact (bright part), and irregularity of luminance occurs in the in-plane of the EL element.

Particularly, in the case of an illumination device, it is easy for a finger or the like to contact the device, in terms of a practical aspect, whereby irregularity of luminance also easily occurs.

SUMMARY OF THE INVENTION

The invention was made in view of the above-described situation, and has an object to provide an EL panel and an EL illumination device which does not have irregularity of luminance in the in-plane of the EL element by providing a protection sheet for suppressing heat transfer on the outermost surface of the EL element.

In order to achieve the above object, the invention provides means as described below.

That is, the invention of claim 1 is an EL panel which includes: a light-transmissive substrate; an EL element including a light-emitting medium layer interposed between a cathode and an anode, the EL element being provided on one surface of the light-transmissive substrate; and a protection sheet on the other surface of the light-transmissive substrate of the EL element. The protection sheet has a surface opposite to the light-transmissive substrate, the shape of the surface includes rounded convex shapes and prism shapes. The shapes has an apex that is a center point of a cross-section farthest from a bottom surface where the cross-section is parallel to the bottom surface of the unit convex shape and the area becomes smaller in a direction from the bottom surface of the rounded convex shape to a top portion thereof. Where the height of the apex is represented as Tc, the distance between the apexes of adjacent rounded convex portions is represented as Bc, and the height of the prism shape is represented as Tp, the following formula is satisfied.

$$2(Tc-Tp) \leq Bc \leq 10(Tc-Tp) \qquad \text{(Equation 1)}$$

The invention of claim 2 is the EL panel according to claim 1, in which the prism-shaped areas of the protection sheet are periodically arranged.

The invention of claim 3 is the EL panel according to claim 1 or 2, in which the rounded convex-shaped areas of the protection sheet are arranged at random.

The invention of claim 4 is the EL panel according to any one of claims 1 to 3, in which the thickness of the protection sheet is 50 μm to 500 μm.

The invention of claim 5 is the EL panel according to any one of claims 1 to 4, in which the thermal conductivity of the protection sheet is 0.08 W/(m·K) to 0.5 W/(m·K).

The invention of claim 6 is the EL panel according to any one of claims 1 to 5, in which the protection sheet is formed of any of a methacryl resin, a styrene resin, an ethylene resin, a polycarbonate resin, and a polyethylene terephthalate resin, or a copolymer formed of a combination of any of them.

The invention of claim 7 is an illumination device in which the EL panel according to any one of claims 1 to 6 is used.

The invention of claim 8 is a display device in which the EL panel according to any one of claims 1 to 6 is used.

Effects of the Invention

The invention was made in view of the above-described situation, and can provide an EL element and an EL illumination device in which irregularity of luminance does not easily occur in the in-plane of the EL element, by providing a protection sheet having rounded convex shapes and prism shapes on the outermost surface of an EL panel to suppress heat transfer.

BRIEF DESCRIPTION OF THE DRAWINGS

FIG. 11 is a view showing examples of arrangement of rounded convex-shaped areas according to the embodiment.

FIG. 13 is a view showing examples of the shape of rounded convex portions according to the embodiment.

FIG. 14 is a view showing prism shapes according to the embodiment.

FIG. 16 is a diagram showing the height of rounded convex shapes, the arrangement of the rounded shapes in an area, and evaluation results when the height of the prism shape is changed in the protection sheet according to the embodiment.

DESCRIPTION OF THE PREFERRED EMBODIMENTS

Hereinafter, an embodiment of the invention will be described with reference to drawings.

Figure 1:
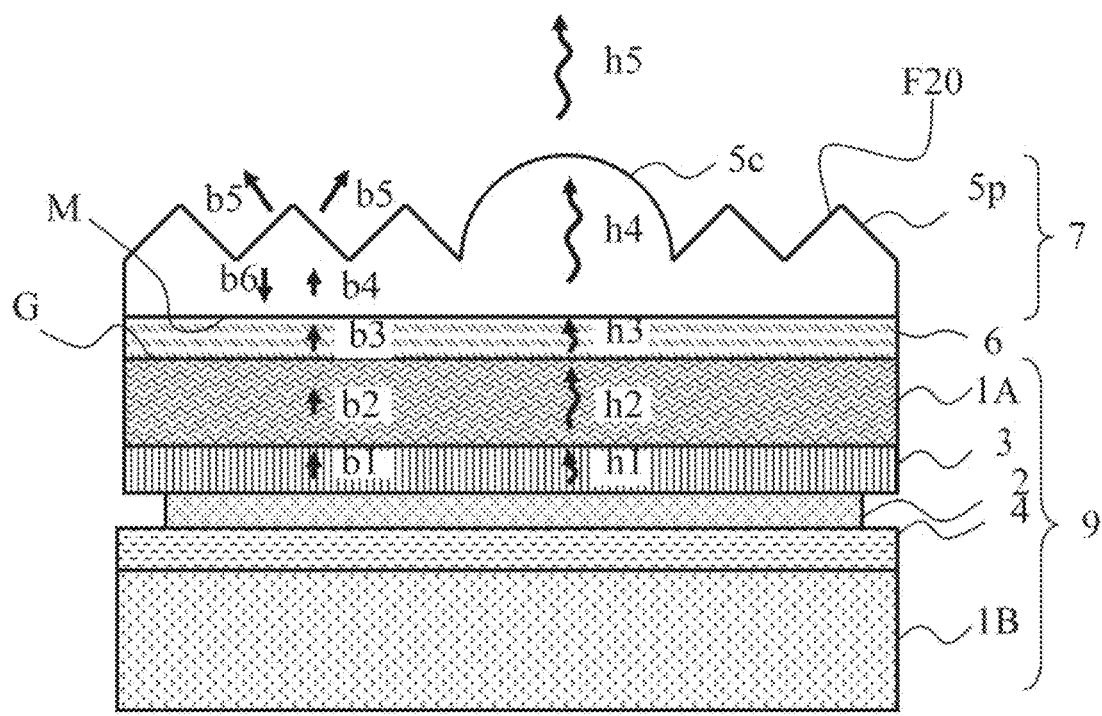
FIG. 1 is a view showing a configuration of an EL panel according to an embodiment.

FIG. 1 is a view showing a configuration of an EL panel 100 according to the embodiment.

As shown in FIG. 1, the EL panel 100 of the present invention is formed with a light-emitting medium layer 2 which is interposed with an anode 3 and a cathode 4 between a light-transmissive substrate 1A and a substrate 1B.

Next, the EL panel 100 of the invention is configured such that a protection sheet 7 is provided on the side of a light-emitting face of an EL element 9, that is, on an output face G of the opposite side of the surface where the anode 3 of a transparent substrate 1B is stacked via a sticking-adhesive layer 6.

Herein, the EL element 9 is a device possessing a function of emitting light, and the light-emitting medium layer 2 outputs light by applying a voltage to the anode 3 and the cathode 4.

The output light passes through the anode 3 (b1), further passes through the transparent substrate 1A (b2), passes through the sticking-adhesive layer 6 (b3), and then is incident to an incidence face M of the protection sheet 7.

Next, the light incident from the incidence face M of the protection sheet 7 passes through the protection sheet 7 (b4), and converges and scatters in a rounded convex-shaped area 5c and a prism-shaped area 5p on the outermost surface F20 of the protection sheet 7 to be output (b5).

In addition, part of the light is reflected on the outermost surface F20 of the protection sheet 7 (h6).

Furthermore, the rounded convex-shaped area 5c and the prism-shaped area 5p contributes to a reduction in the above-described reflected light (h6) on the outermost surface F20 of the protection sheet 7.

In addition, a large amount of heat is generated on the light-emitting medium layer 2 because approximately 25% of electric energy input thereto turns into light and the remaining 75% thereof turns into heat.

The heat generated in the light-emitting medium layer 2 is transmitted through the anode 3 (h1), the light-transmissive substrate 1A (h2), and the sticking-adhesive layer 6 (h3), and to the incidence face M of the protection sheet 7.

Next, the heat transmitted to the incidence face M of the protection sheet 7 is transmitted to the outermost surface F20 of the protection sheet 7 (h4).

Furthermore, the heat transmitted to the outermost surface F20 of the protection sheet 7 turns into heat transmitted to the outside of the EL panel 100 (h5).

Figure 2:
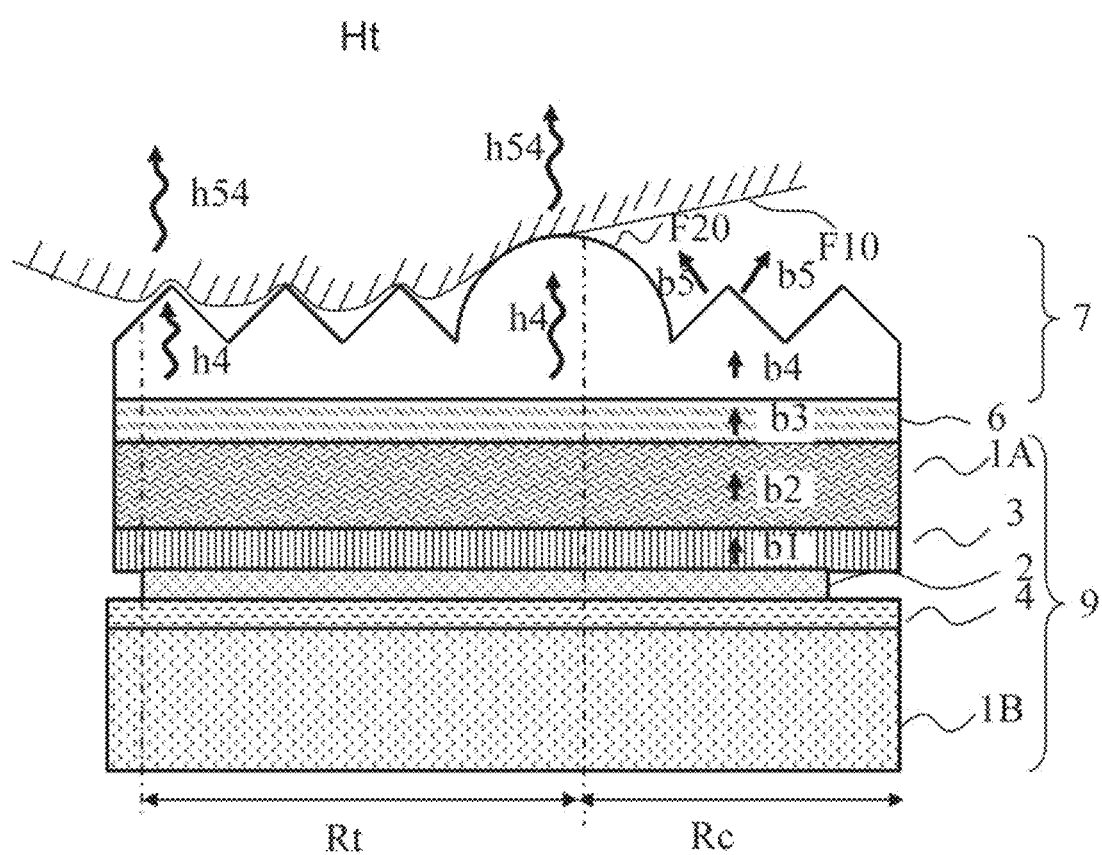
FIG. 2 is a view showing a case where a heat transfer body is in contact with an EL panel according to the embodiment.

Next, heat transmission when a heat transfer body Ht such as a finger or the like is in contact with the outermost surface F20 of the protection sheet 7 will be described using FIG. 2.

When the heat transfer body Ht such as a finger or the like is in contact with the outermost surface F20, the heat transmitted to the inside of the protection sheet 7 (h4) is transferred to the surface F10 of the above-described heat transfer body from the outermost surface F20 of the protection sheet 7, and then to the inside of the heat transfer body Ht (h54).

Since the light emission efficiency in an area Rt of the EL panel 100 where heat is transferred decreases as heat of the light-emitting medium layer 2 is lost and accordingly the temperature of the light-emitting medium layer 2 is lowered, light exiting from the light-emitting medium layer 2 (b1) decreases, and as a result, light (b5) exiting from the EL panel 100 is reduced.

In an area Rc where heat is not transferred, since the light emission efficiency of the light-emitting medium layer 2 does not decrease, the same amount of light (b5) as in the case where the heat transfer body Ht does not contact the outermost surface is output.

For this reason, irregularity of luminance occurs in the in-plane of the EL panel 100 when the heat transfer body Ht such as a finger or the like is in contact with the EL panel 100.

Herein, the amount of heat transferred from the outermost surface F20 of the protection sheet 7 to the surface F10 of the heat transfer body depends on the configuration of the outermost surface F20 of the protection sheet 7.

Figure 3:
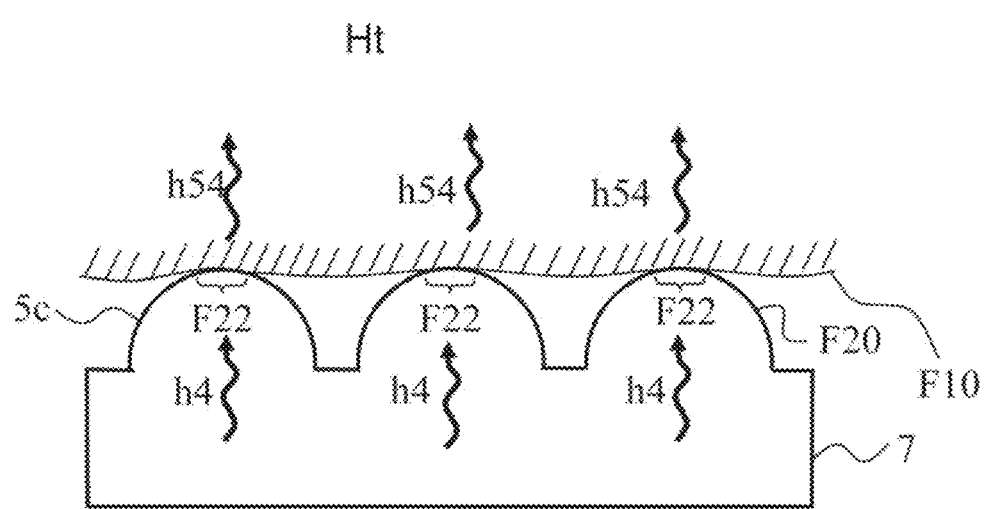
FIG. 3 is a view showing a case where a heat transfer body is in contact with the outermost surface of an example of a protection sheet.

In the case where the outermost surface F20 of the protection sheet 7 has only the rounded convex-shaped areas 5c as shown in FIG. 3, since an area F22 on the outermost surface F20 of the protection sheet 7 which comes into contact with the surface F10 of the heat transfer body is wide, heat is transferred thereto with ease.

Figure 4:
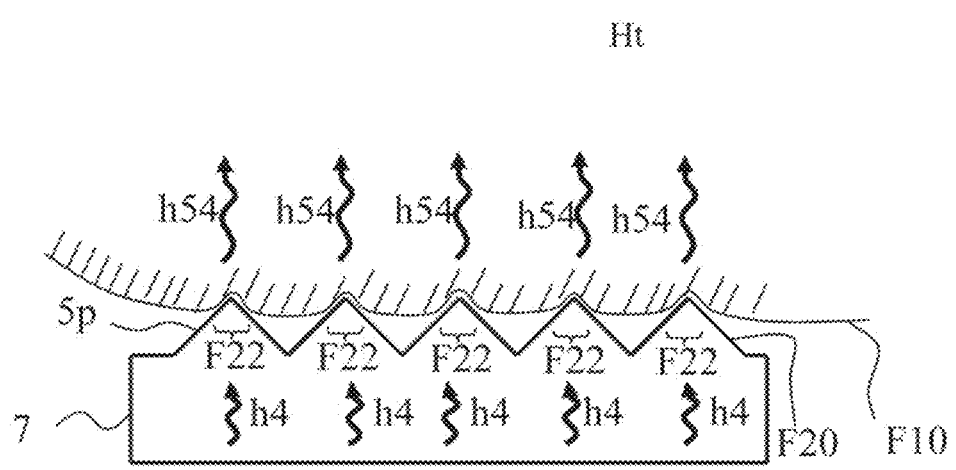
FIG. 4 is a view showing a case where a heat transfer body is in contact with the outermost surface of an example of the protection sheet.
Figure 5:
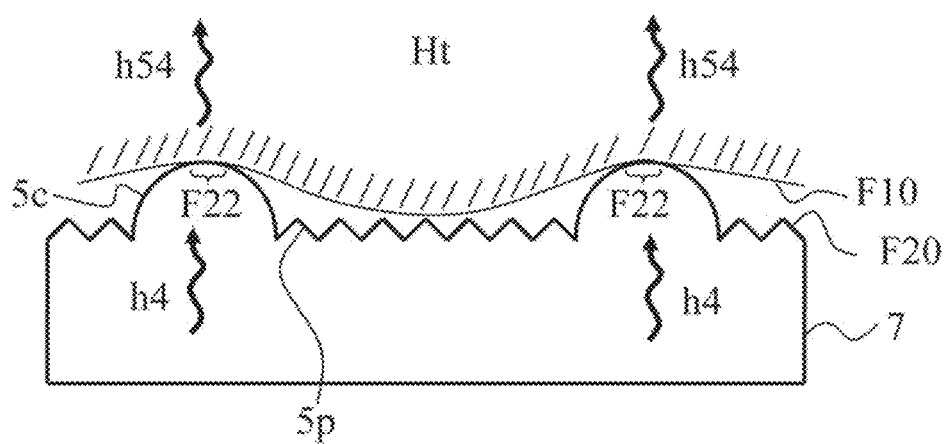
FIG. 5 is a view showing a case where a heat transfer body is in contact with the outermost surface of a protection sheet according to the embodiment.

In addition, in the case where the outermost surface F20 of the protection sheet 7 has only the prism-shaped areas 5p as shown in FIG. 4, since the area F22 on the outermost surface F20 of the protection sheet 7 which comes into contact with the surface F10 of the heat transfer body is wide, heat is transferred thereto with ease.

Figure 6:
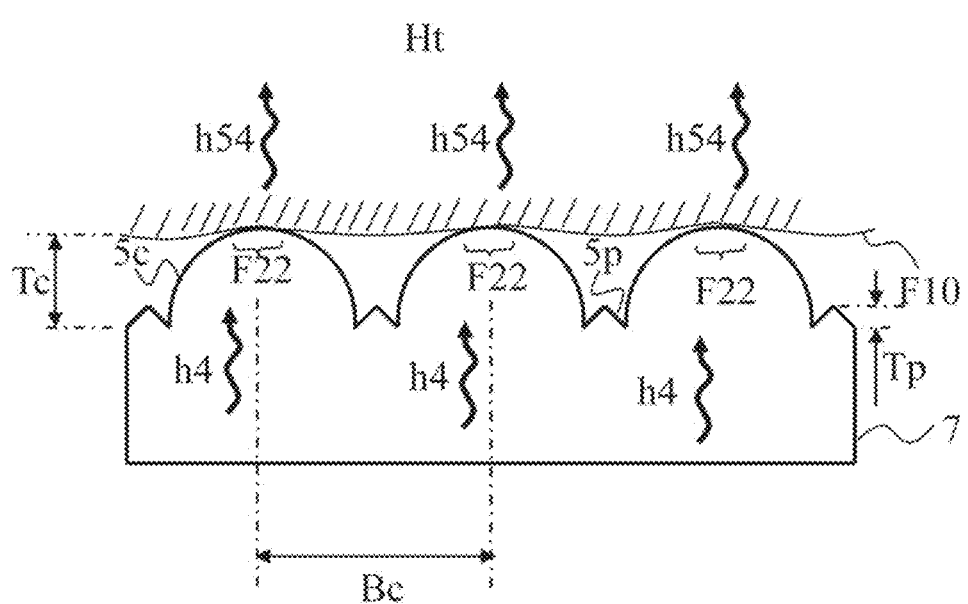
FIG. 6 is a view showing a case where a heat transfer body is in contact with the outermost surface of another example of the protection sheet.

On the other hand, when there are the rounded convex-shaped areas 5c and the prism-shaped areas 5p on the outermost surface F20 of the protection sheet 7 as shown in FIG. 6, the area F22 on the outermost surface F20 of the protection sheet 7 which comes into contact with the surface F10 of the heat transfer body becomes narrow.

For this reason, heat is less easily transferred in the above case than in the case of single units of the prism-shaped area 5p and the rounded convex-shaped area 5c, and therefore, it is difficult for irregularity of luminance to occur in the in-plane of the EL panel 100.

When the height of the above-described rounded convex-shaped area is represented as Tc and the height of the above-described prism-shaped area is represented as Tp, an interval Bc between which the above-described rounded convex-shaped areas 5c are arranged is preferably higher than or equal to 2(Tc−Tp) and lower than or equal to 10(Tc−Tp).

If the interval Bc between which the above-described rounded convex-shaped areas 5c are arranged is narrower than 2(Tc−Tp) as shown in FIG. 6, the surface F22 which comes into contact with the surface F10 of the heat transfer body becomes wide, causing easy transfer of heat, whereby irregularity of luminance easily occurs.

Figure 7:
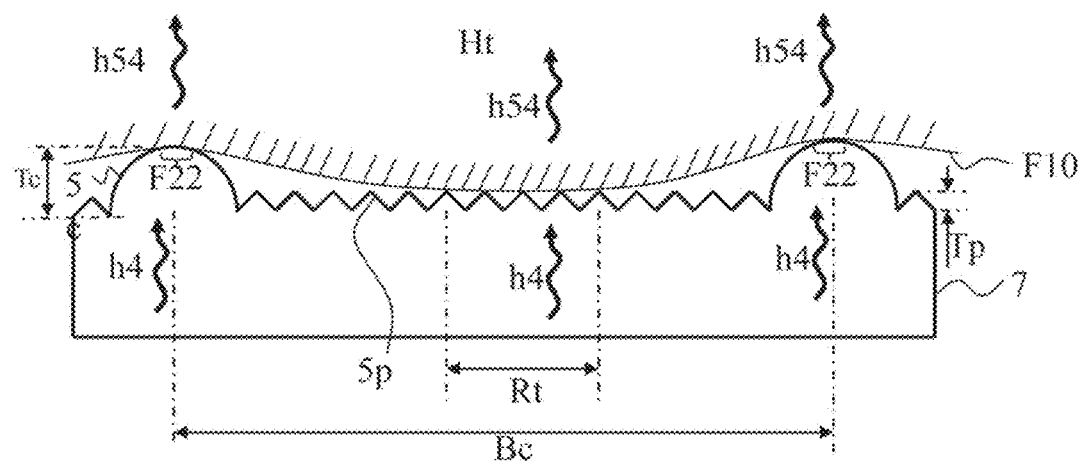
FIG. 7 is a view showing a case where a heat transfer body is in contact with the outermost surface of another example of the protection sheet.

On the other hand, if the interval Bc between which the above-described rounded convex-shaped areas 5c are arranged is wider than 10(Tc-Tp) as shown in FIG. 7, an area Rt in which the surface F10 of the heat transfer body comes into contact with the prism-shaped area 5p is made, causing easy transfer of heat, whereby irregularity of luminance easily occurs.

The configuration of the outermost surface F20 of the protection sheet 7 is obtained by three-dimensional shape measurement with a laser microscope.

Figure 8:
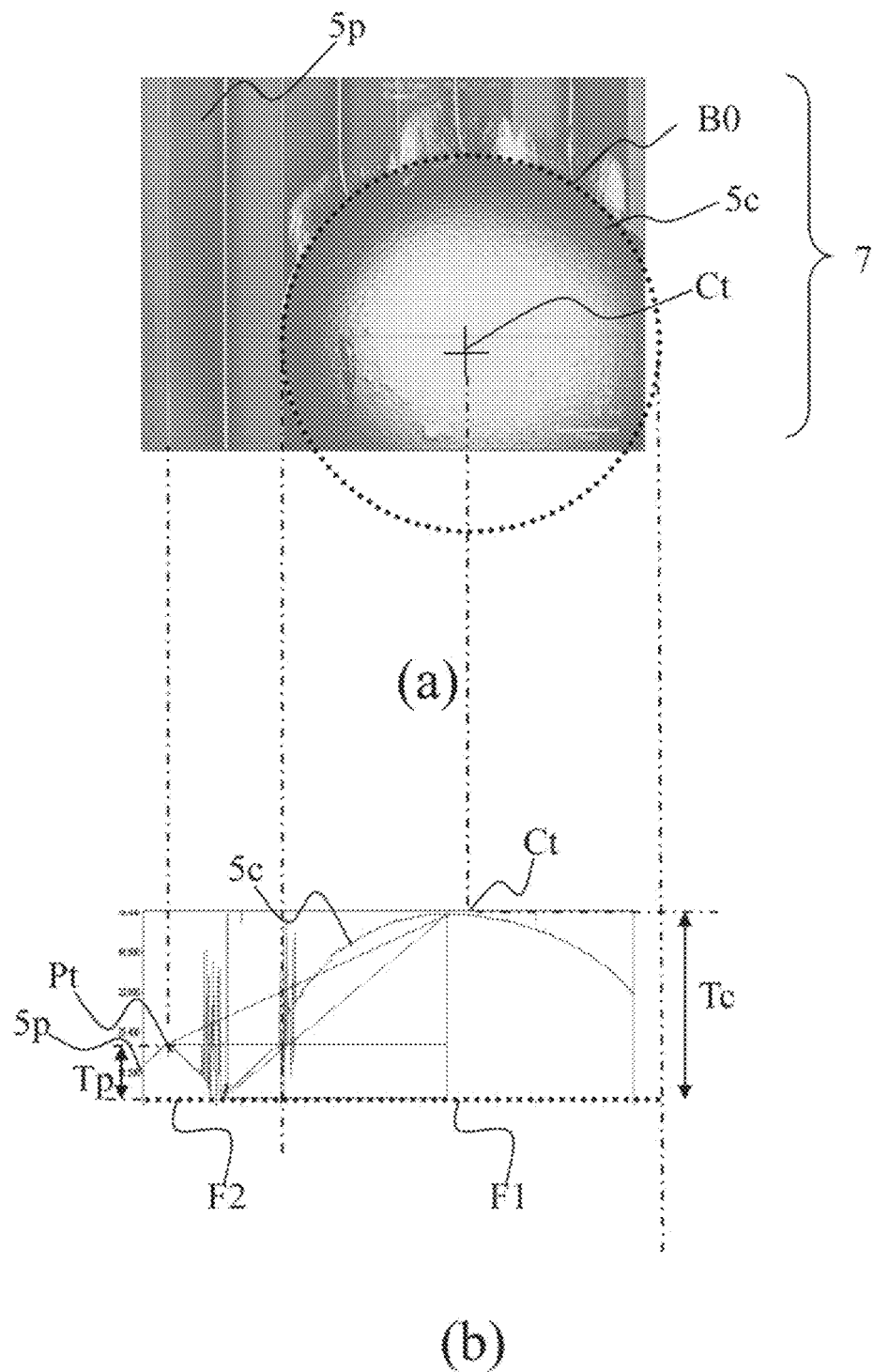
FIG. 8 is a view obtained by observing a protection sheet with a laser microscope.

FIG. 8 is the three-dimensional shape of the protection sheet 7 obtained by measurement.

Next, based on the obtained three-dimensional configuration, a boundary B0 of the rounded convex-shaped area 5c and the prism-shaped area 5p is obtained.

The surface which is close to the base of the prism-shaped area 5p is represented as a bottom surface F0 of the outermost surface F20, the inner part of the boundary B0 is represented as a bottom surface F1 of the rounded convex-shaped area 5c, and the outer part of the boundary B0 is represented as a bottom surface F2 of the prism-shaped area 5p.

(Step 1)

Next, a point Ct which is the farthest point from the bottom surface F1 is represented as the apex Ct of the rounded convex-shaped area 5c, and the height Tc of the rounded convex-shaped area 5c is simply obtained from the distance to the bottom surface F1.

Furthermore, the height Tp of the prism-shaped area 5p is obtained from the distance to the bottom surface F2 of the prism-shaped area 5p.

In addition, a distance Bc between apexes Ct of adjacent rounded convex-shaped areas 5c is obtained, and calculation is performed as to whether or not (Equation 1) is satisfied.

(Step 2)

It is determined whether or not the above-described outermost surface F20 has an area satisfying the condition in the above-described Steps 1 and 2.

$$2(Tc-Tp) \leq Bc \leq 10(Tc-Tp) \qquad \text{(Equation 1)}$$

Figure 9:
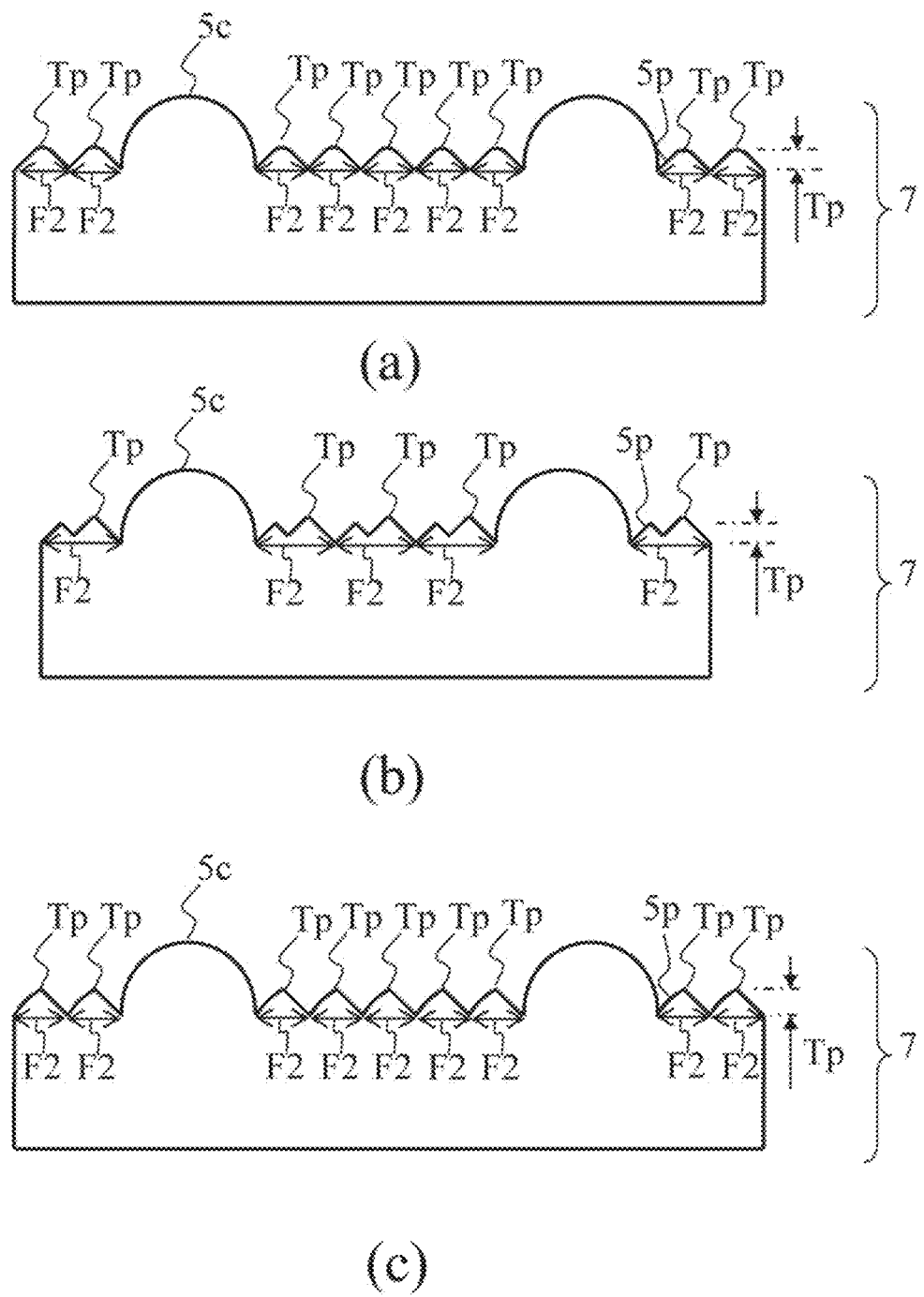
FIG. 9 is a view showing examples of a prism shape according to the embodiment.

As the prism-shaped area 5p, the top portion Pt of the prism-shaped area 5p can have a rounded shape as shown in FIG. 9 (a), an asymmetric shape as shown in FIG. 9 (b), or a curved shape as shown in FIG. 9 (c).

Figure 10:
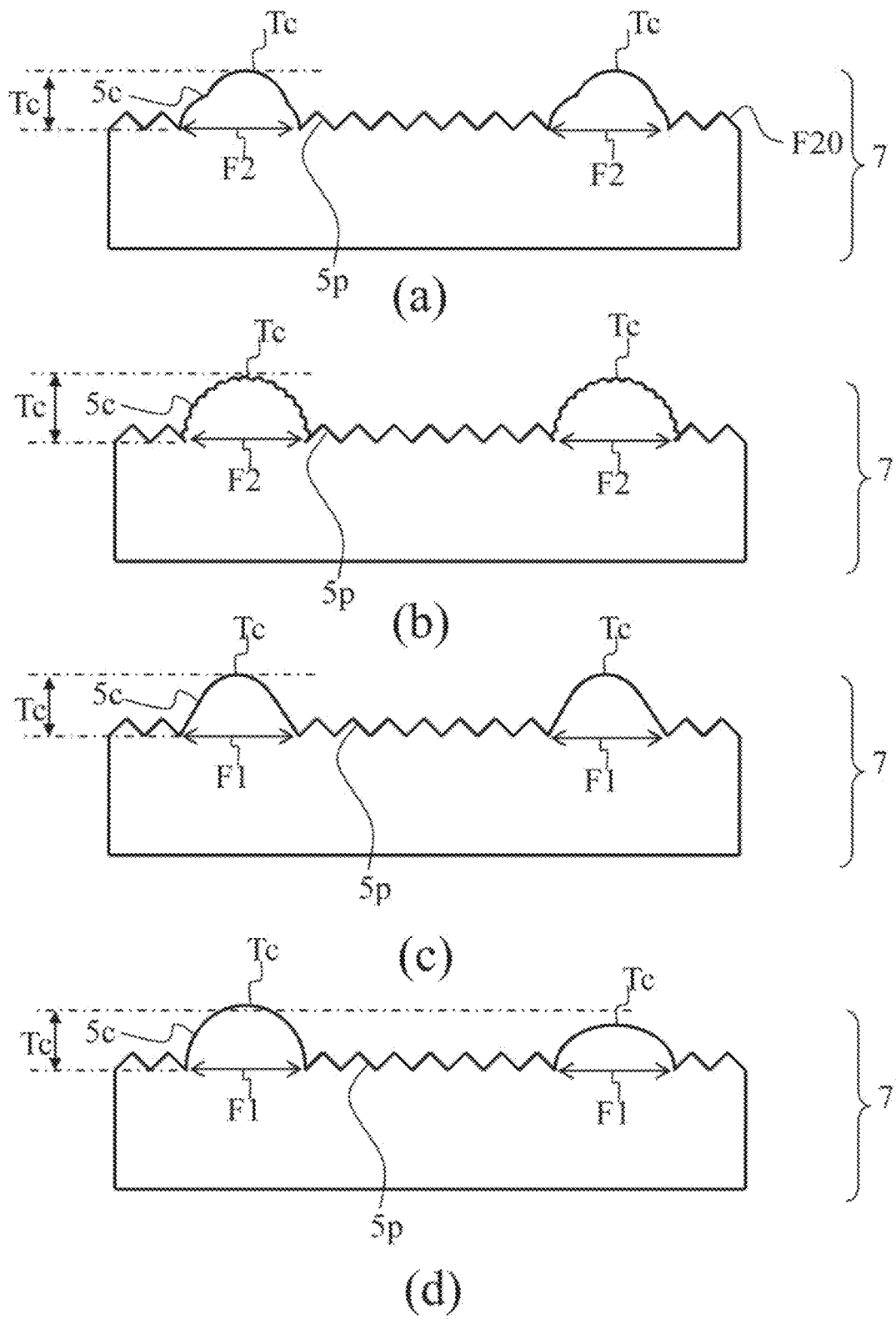
FIG. 10 is a view showing examples of rounded convex shapes according to the embodiment.

As the rounded convex-shaped area 5c, the top with a multi-stage curve as shown in FIG. 10 (a) can be used.

In such a case, a contact area can be further reduced by making the curved part of the upper stage smaller than the curved part of the lower stage, as shown in FIG. 10 (a).

In the case of a curved face having unevenness as shown in FIG. 10 (b), since the recessed portion is not brought into contact with a heat transfer body, a contact area can also be reduced.

In a case of such an area being constituted by a curved line and a straight line as shown in FIG. 10 (c), a contact area with the heat transfer body can be reduced in the same manner as the straight-lined portion in a trapezoidal shape in the lower part narrows down the curved area of the upper portion.

In addition, it is possible to have such areas having shapes with different heights as shown in FIG. 10 (d).

In such a case, if a contacting pressure is small, the heat transfer body comes into contact only with a higher convex portion, and therefore, a contact area can be reduced.

If the rounded convex-shaped area 5c includes convex portions with different sizes as shown in FIG. 10 (d), an average value of adjacent rounded convex-shaped areas 5c can be used for the height Tc thereof.

Next, the arrangement of the rounded convex-shaped area 5c is preferably the arrangement introduced below.

The rounded convex-shaped areas 5c may be arranged, for example, periodically as shown in FIG. 11 (a), or at random as shown in FIG. 11 (n).

In the case where the rounded convex-shaped areas 5c are arranged at random, it is preferable in that moiré fringes should not be generated.

Figure 12:
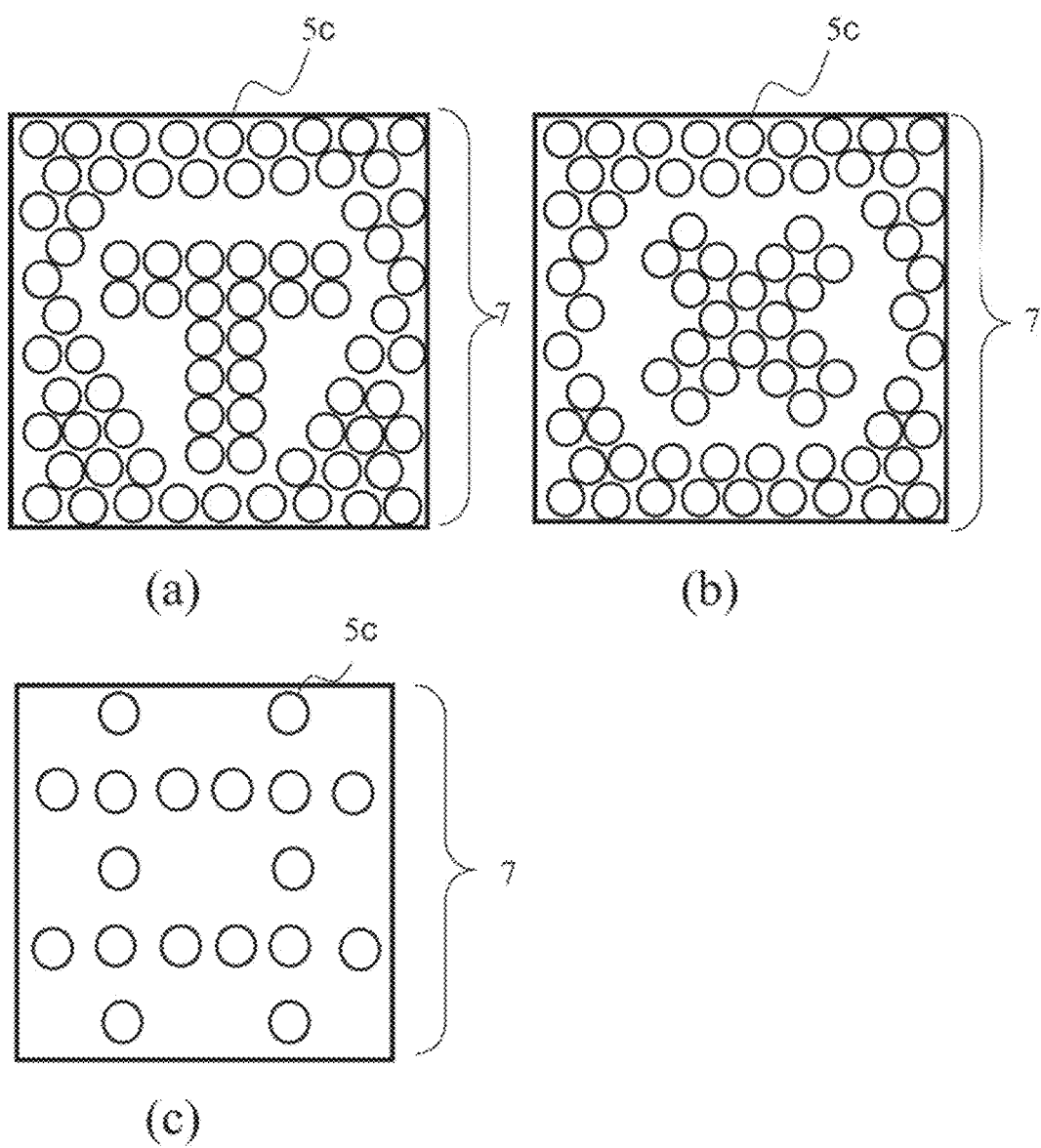
FIG. 12 is a view showing examples of arrangement of rounded convex-shaped areas according to the embodiment.

In addition, when the above-described EL panel 100 is used to be applied to illumination, the rounded convex-shaped areas 5c can be arranged in the form of a logo as shown in FIG. 12 (a), a mark as shown in FIG. 12 (b), a pattern as shown in FIG. 12 (c) or the like according to the density thereof in order to add a design factor.

Furthermore, the above-described rounded convex-shaped areas 5c are not necessarily arranged in a single shape, and may be arranged in different shapes as shown in FIG. 13 (*a*) to (*d*).

In addition, the prism-shaped areas 5p are preferably arranged as shown below.

The areas can be arranged in a shape extending to one direction as shown in FIG. 14 (*a*), or can be arranged in a shape extending in two directions as shown in FIG. 14 (*b*).

It is possible to arrange the prism-shaped areas 5p without a space by periodically arranging the prism-shaped areas 5p.

Furthermore, the thickness of the protection sheet 7 is preferably thicker than or equal to 50 μm, and thinner than or equal to 500 μm.

If it is thinner than 50 μm, heat of the light-emitting medium layer 2 is easily transferred to the heat transfer body Ht, whereby irregularity of luminance easily occurs.

If it is thicker than 500 μm, heat is insufficiently released, and therefore, sufficient current does not flow to the light-emitting medium layer 2.

Therefore, satisfactory luminance as illumination cannot be obtained.

Next, as a forming material of the above-described protection sheet 7, PET (polyethylene terephthalate), PC (polycarbonate), PMMA (polymethyl methacrylate), COP (cycloolefin polymer), an acrylonitrile styrene copolymer, an acrylonitrile polystyrene copolymer, an acrylonitrile-butadiene-styrene copolymer, a melamine resin, a thiourethane resin, an episulfide resin, or the like can be used.

Thermal conductivity (W/(m·K)) is 0.3 to 0.4 for melamine resin, approximately 0.2 for polycarbonate resin, 0.2 to 0.29 for acrylonitrile styrene copolymer, 0.2 to 0.29 for acrylonitrile-butadiene-styrene copolymer, 0.25 to 0.34 for polyethylene resin, approximately 0.21 for methacrylate resin, and 0.08 to 0.12 for styrene resin, which are preferable as it is difficult to transfer heat with a lower thermal conductivity than 0.55 to 0.75 of soda glass.

In addition, a base material layer 10 may be included, or it is preferable to use a resin with low brittleness as the base material layer 10.

As a material, (a-) PET, polycarbonate, (poly)urethane resin, epoxy, resin, (poly)ethylene resin, acrylic resin, acrylonitrile (poly)styrene resin, ABS resin, or the like can be exemplified.

The rounded convex-shaped areas 5c and the prism-shaped areas 5p can be formed by pressing such a resin into a mold with a line speed of 1 m/min to 30 m/min.

If the speed is lower than 1 m/min, acryl resin reacts with oxygen or moisture in the air before being pressed into the mold, and therefore, molding is not performed well, but if the speed is higher than 30 m/min, mixing of air bubbles occurs.

Furthermore, a protection sheet can be obtained by irradiating with ultraviolet rays of 500 mJ/m$^2$ to 3000 mJ/m$^2$ for curing.

In regard to such acryl resin, mono-functional acryl resin and multi-functional acryl resin are mixed in a timely manner, whereby a surface reinforcing performance of the surface and a light extraction effect can be compatible.

The protection sheet 7 can be produced by performing embossing for a resin film.

The forming rate of 70% or higher is good at this time, and is preferably higher than or equal to 85%, which is a level at which a difference in optical characteristics rarely occurs in most cases.

The pressure condition of embossing at this time is 5 to 500 kg/cm of general linear pressure, preferably 5 to 300 kg/cm, and more preferably 10 to 150 kg/cm.

When the linear pressure is smaller than 5 kg/cm, the forming rate is less than 70%, which is insufficient to form irregular configurations.

When the linear pressure is greater than 10 kg/cm, an 85% or higher forming rate is obtained, which is more preferable.

In the case of linear pressure of 500 kg/cm, a load onto a machine is excessive, which is not practical.

In addition, if linear pressure is lower than or equal to 300 kg/cm, load onto a machine is not excessive even if the width of a film exceeds 1 m.

If linear pressure is 150 kg/cm, a forming rate of 99% to 100% is obtained, and therefore, the forming rate cannot be raised any more.

In addition, an EL element is used in various environments, and use of the device in a place where the device is exposed to a large amount of ultraviolet rays, for example, outdoor use or the like can be considered.

In such a case, deterioration loss occurs by irradiating the inside of the EL element with ultraviolet rays.

For this reason, irradiation of the inside of the EL element with ultraviolet rays from outside can be suppressed and deterioration loss can be alleviated by incorporating an ultraviolet ray absorbing material inside the protection sheet 7, in a sticking-adhesive material, or in a diffuser panel.

Next, respective constituent elements of the EL panel 100 other than the protection sheet 7 will be described.

The substrate 1B is formed of glass, metal, resin, or the like in a plate shape.

Next, the cathode 3 is formed on the surface of the light-emitting medium layer 2 side of the substrate 1B.

The cathode 3 is a layer possessing electric conductivity, and applies a voltage onto the light-emitting layer 2.

The cathode 3 is configured to use deposition of aluminum on the substrate 1A formed of aluminum or the like.

In addition, a material possessing electric conductivity is not limited to aluminum as described above, and various kinds of metal including gold, silver, copper, or the like, or carbon possessing conductivity can also be used.

Furthermore, the transparent substrate 1A has a function of transmitting light emitted from the light-emitting layer 2.

For a material of the light-transmissive substrate 1A, various kinds of glass materials can be used as an inorganic material.

As an organic material, a plastic material such as PMMA, polycarbonate, polystyrene, or the like can also be used.

A material which is particularly preferable here is a cycloolefin-based polymer, and this polymer material is appropriate in that a resin has excellent characteristics of workability, heat resistance, water resistance, optical translucency, and the like.

In addition, it is preferable to form the light-transmissive substrate 1A with a material possessing the transmittance to whole light of 50% or higher in order to transmit light from the light-emitting layer 2 as much as possible.

Next, the anode 4 is formed on the surface in the side of the light-emitting medium layer 2 of the transparent substrate 1B.

The anode 4 is a layer possessing electric conductivity, and applies a voltage to the light-emitting layer 2.

The anode 4 is configured to use deposition of a transparent conductor such as ITO, ZnO, or the like.

Next, the sticking-adhesive layer 6 is formed in the side of the output face G of the transparent substrate 1A, and fixes the protection sheet 7 to the transparent substrate 1B.

Herein, as a sticking-adhesive agent constituting the sticking-adhesive layer 6, for example, acryl-based, urethane-based, rubber-based, and silicone-based sticking-adhesive agents are adopted.

Since any material has to be used inside a backlight unit at a high temperature, it is preferable to use a material possessing a storage elastic modulus G' at 100° C. higher than or equal to 1.0E+04 (Pa).

In addition, in order to output light with uniform intensity, transparent fine particles, for example, beads, may be mixed into the sticking-adhesive layer 6.

Furthermore, as the sticking-adhesive agent, a double-sided tape may be used.

Figure 15:
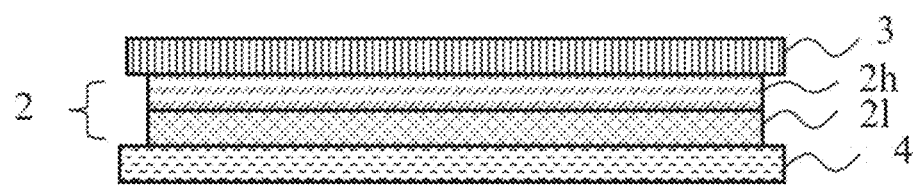
FIG. 15 is a view showing an example of a configuration of a light-emitting medium layer.
Figure 17:
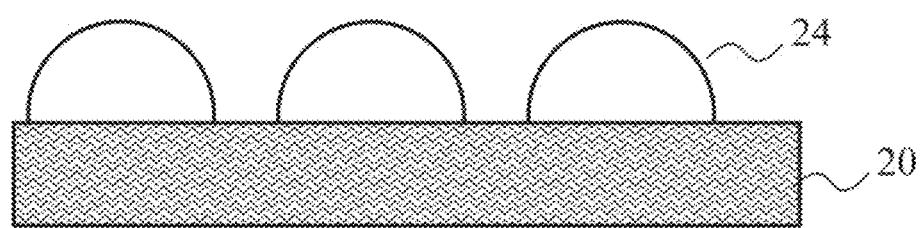
FIG. 17 is a view showing an example of a conventional micro-lens element.

Furthermore, the light-emitting medium layer 2 is preferably configured to include a hole transport layer 2h and a light-emitting layer 2l as shown in FIG. 15.

Furthermore, the above-described light-emitting medium layer 2 may be provided with an electron injection layer (not shown in the drawing), an electron blocking layer (not shown in the drawing), and a layer functioning as an electron transport layer (not shown in the drawing) depending on necessity.

A layer which is laminated between the anode 3 and the light-emitting layer 2l is a hole injection layer (not shown in the drawing), the electron blocking layer (not shown in the drawing), and a hole transport layer 2h. A layer which is formed between the light-emitting layer 2l and the cathode 4 is a hole block layer (not shown in the drawing), the electron injection layer (not shown in the drawing), and the electron transport layer (not shown in the drawing).

The layers may be multi-layered layers, or one layer may have functions of two or more layers.

The electron injection layer, the electron blocking layer, and the electron transport layer can appropriately select the laminating method in accordance with each of materials thereof as to be described below, but it is possible to obtain the EL element 9 which is further stabilized with excellent thermal stability and tolerance, particularly by selecting an inorganic material.

As a hole transport material composing the hole transport layer 2h, a polyaniline derivative, a polythiophene derivative, a polyvinyl carbazole (PVK) derivative, poly(3,4-ethylenedioxythiophene) (PEDOT), or the like can be exemplified, but the present invention is not limited thereto.

Such a material is dissolved or dispersed in a solvent, and can be collectively coated using a spin coating method, an extrusion coating method, or a dip coating method.

In addition, a uniform line pattern without a defect in film formation can be obtained at a pixel pitch by using the letterpress printing method.

In addition, when an inorganic material is used as a hole transport material, an oxide, a nitride, an oxynitride of chromium (Cr), tungsten (W), vanadium (V), niobium (Nb), tantalum (Ta), molybdenum (Mo), titanium (Ti), zirconium (Zr), hafnium (Hf), scandium (Sc), yttrium (Y), manganese (Mn), iron (Fe), ruthenium (Ru), osmium (Os), cobalt (Co), nickel (Ni), copper (Cu), zinc (Zn), cadmium (Cd), or the like can be formed as an inorganic material using the vacuum deposition method.

In this case, collective formation or a line pattern can be obtained by using an arbitrary shadow mask.

By providing a hole transport layer composed of an inorganic substance, it is possible to obtain the EL element 9 which is further stabilized with excellent thermal stability and tolerance.

In addition, an interlayer (not shown in the drawing) possessing functions of hole injection and electron blocking can be formed as a hole transport layer between the anode 3 and the light-emitting layer after formation thereof.

As a material to be used in the interlayer, polymers including aromatic amines such as polyvinyl carbazole or a derivative thereof, a polyarylene derivative having an aromatic amine in a side chain or the main chain, an arylamine derivative, a triphenyldiamine derivative, or the like can be exemplified, but the invention is not limited thereto.

The material of the interlayer is dissolved or dispersed in a solvent, and the formation is performed using various coating methods using a spin coater or the like, a letterpress printing method, a gravure printing method, a screen printing method, or the like.

In addition, when an inorganic material is used as the material of the interlayer, an oxide, a nitride, an oxynitride of chromium (Cr), tungsten (W), vanadium (V), niobium (Nb), tantalum (Ta), molybdenum (Mo), titanium (Ti), zirconium (Zr), hafnium (Hf), scandium (Sc), yttrium (Y), manganese (Mn), iron (Fe), ruthenium (Ru), osmium (Os), cobalt (Co), nickel (Ni), copper (Cu), zinc (Zn), cadmium (Cd), or the like can be formed as an inorganic material using the vacuum deposition method.

In this case, collective formation or a line pattern can be obtained by using an arbitrary shadow mask.

By providing an interlayer composed of an inorganic substance, it is possible to obtain the EL element 9 which is further stabilized with excellent thermal stability and tolerance.

The light-emitting layer 2l may serve as a white light-emitting layer or a single color light-emitting layer such as blue, red, yellow, green, or the like.

Herein, when a white light-emitting layer is used as the light-emitting medium layer 2, the composition of anode 3/light-emitting medium layer 2/cathode 4 may be configured to be, for example, ITO/CuPc (copper phthalocyanine)/α-NPD doped with 1% of rubrene/dinacuthylanthracene doped with 1% of perylene/Alq3/lithium fluoride/Al as the cathode 4.

The light-emitting layer 2l is formed after the formation of the interlayer.

The light-emitting layer 2l is a layer emitting light by running current thereinto, and as an organic light-emitting material for forming the light-emitting layer 2l, for example, a substance obtained by dispersing a light-emitting pigment such as coumarin-based, perylene-based, pyran-based, anthrone-based, porphyrin-based, quinacridone-based, N,N'-dialkyl substitution quinacridone-based, naphthalimide-based, N,N'-diaryl substitution pyrrolopyrrole-based, iridium complex-based pigment or the like, into polymeric molecules such as polystyrene, polymethylmethacrylate, polyvinyl carbazole, or the like, or a polymeric material such as a polyarylene-based, a ployarylenevinylene-based, or a polyfluorene-based material can be exemplified, but the present invention is not limited thereto.

These organic light-emitting materials are dissolved or stably dispersed in a solvent to become an organic light-emitting ink.

As a solvent into which such an organic light-emitting material is dissolved or dispersed, a single or a mixed solvent of toluene, xylene, acetone, anisole, methyl ethyl ketone, methyl isobutyl ketone, cyclohexanone, and the like can be exemplified.

Among these, aromatic organic solvents such as toluene, xylene, and anisole are preferable in terms of solubility of an organic light-emitting material.

In addition, a surfactant, an antioxidant, a viscosity modifier, an ultraviolet absorber, and the like may be added to an organic light-emitting ink as needed.

In addition to the above-described polymeric material, a small molecule-based light-emitting material can be used, such as a 9,10-diarylanthracene derivative, pyrene, coronene, perylene, rubrene, 1,1,4,4-tetraphenylbutadiene, a tris(8-quinolate)aluminum complex, a tris(4-methyl-8-quinolate)aluminum complex, a bis(8-quinolate) zinc complex, a tris(4-methyl-5-trifluoromethyl-8-quinolate)aluminum complex, a tris(4-methyl-5-cyano-8-quinolate)aluminum complex, a bis(2-methyl-5-trifluoromethyl-8-quinolate) [4-(4-cyanophenyl)phenolate]aluminum complex, a bis(2-methyl-5-cyano-8-quinolinato) [4-(4-cyanophenyl)phenolate] aluminum complex, a tris(8-quinolinato) scandium complex, a bis[8-(paratosyl)aminoquinoline]zinc complex and cadmium complex, 1,2,3,4-tetraphenyl cyclopentadiene, poly-2,5-diheptyl oxyparaphenylene vinylene, or the like.

As a method of forming the light-emitting medium layer 2, a known film forming method can be used, such as a dry coating method including the vacuum deposition method, the CVD method, or the like, a wet coating method including the ink jet printing method, the letterpress printing method, the gravure printing method, the screen printing method, or the like according to materials.

(Production Method of Protection Sheet)

Next, an example of a production method of the protection sheet 7 will be described.

EXAMPLE 1

A UV-curable resin of which the main ingredient is urethane acrylate for forming a pattern of the protection sheet 7 was applied onto biaxially-oriented and easily-adhesive PET film for optical purposes (film thickness of 125 μm), and the UV-curable resin was cured by exposing the PET film to ultraviolet rays while transporting the film applied with the UV-curable resin into a cylinder mold that was cut in the shape of the protection sheet 7.

By separating the mold from the PET film after the curing, the protection sheet 7 having the prism-shaped area 5p and the rounded convex-shaped area 5c with the diameter of 140 μm was produced.

EXAMPLE 2

Polycarbonate resin, which is thermoplastic resin, was heated at a temperature of approximately 300° C. to form a film with the thickness of 0.3 mm while stretching the film along a roll. Then, the heated film was cooled down while applying pressure thereto, using the cylinder mold in a concave shape of which the cylinder part was used for performing an etching process for the rounded convex-shaped area 5c and for cutting the prism-shaped area 5p by a cutting tool (the temperature of the cylinder mold was 120° C.), and then, a film molded with a convex-shaped area 5c was obtained.

Accordingly, a protection sheet 7 having a unit convex portion 5 with a diameter of 50 μm could be produced.

EXAMPLE 3

Tables 1, 2, 3, and 4 of FIG. 16 show evaluation results when the height Tc of the rounded convex shape, the interval Bc between which the rounded convex-shaped areas were arranged, and the height Tp of the prism shape was changed.

As shown in FIG. 16, in the condition satisfying (Equation 1), there is no finger mark, and therefore, irregularity of luminance does not occur.

On the other hand, in the condition not satisfying (Equation 1), there is a finger mark, and therefore, irregularity of luminance occurs.

$$2(Tc-Tp) \leq Bc \leq 10(Tc-Tp) \quad \text{(Equation 1)}$$

INDUSTRIAL APPLICABILITY

The present invention can be used in an EL panel (electroluminescent device) used in illumination devices, decorative illuminations, light sources for signs, and the like, and a display device using the EL panel.

What is claimed is:

1. An EL panel comprising:
a light-transmissive substrate;
an EL element comprising a light-emitting medium layer interposed between a cathode and an anode, the EL element being provided on a first surface of the light-transmissive substrate; and
a protection sheet having a first surface and a second surface opposite to the first surface, the protection sheet being provided on a second surface of the light-transmissive substrate, the first surface of the protection sheet being opposite to the second surface of the light-transmissive substrate, wherein
the EL panel does not include a layer that directly contacts with the second surface of the protection sheet,
a plurality of rounded convex portions are provided on the second surface of the protection sheet to form at least one of a logo, a mark, and a pattern according to the density of the convex portions, each of the rounded convex portions being arranged at random and having an interval therebetween, each of the rounded convex portions having an uneven surface,
a plurality of prism portions are periodically provided on the second surface of the protection sheet to extend to one direction or two directions,
each of the convex portions has an apex that is a center point of a cross-section farthest from a bottom surface where the cross-section is parallel to the bottom surface of the convex portion and the area becomes smaller in a direction from the bottom surface to a top portion thereof, and
where the height of the apex is represented as Tc, the distance between the apexes of adjacent convex portions is represented as Bc, and the height of the prism portion is represented as Tp, the following formula is satisfied $$2(Tc-Tp) \leq Bc \leq 10(Tc-Tp).$$

2. The EL panel according to claim 1, wherein a thickness of the protection sheet is 50 μm to 500 μm.

3. The EL panel according to claim 1, wherein a thermal conductivity of the protection sheet is 0.08 W/(m·K) to 0.5 W/(m·K).

4. The EL panel according to claim 1, wherein the protection sheet is formed of any of a methacryl resin, a styrene resin, an ethylene resin, a polycarbonate resin, and a polyethylene terephthalate resin, or a copolymer formed of a combination of any of them.

5. An illumination device in which the EL panel according to claim 1 is used.

6. A display device in which the EL panel according to claim 1 is used.

7. The EL panel according to claim 1, further comprising a sticking-adhesive layer that is formed between the second surface of the light-transmissive substrate and the protection sheet and that fixes the protection sheet to the light-transmissive substrate.

8. An EL panel comprising:
a light-transmissive substrate;
an EL element comprising a light-emitting medium layer interposed between a cathode and an anode, the EL element being provided on a first surface of the light-transmissive substrate; and
a protection sheet having a first surface and a second surface opposite to the first surface, the protection sheet being provided on a second surface of the light-transmissive substrate, the first surface of the protection sheet being opposite to the second surface of the light-transmissive substrate, such that the second surface of the protection sheet forms an outermost layer of the EL panel and is not in direct contact with any other layers, wherein
a plurality of rounded convex portions are provided on the second surface of the protection sheet to form at least one of a logo, a mark, and a pattern according to the density of the convex portions, each of the rounded convex portions being arranged at random and having an interval therebetween, each of the rounded convex portions having an uneven surface,
a plurality of prism portions are periodically provided on the second surface of the protection sheet to extend to one direction or two directions,
each of the convex portions has an apex that is a center point of a cross-section farthest from a bottom surface where the cross-section is parallel to the bottom surface of the convex portion and the area becomes smaller in a direction from the bottom surface to a top portion thereof, and
where the height of the apex is represented as Tc, the distance between the apexes of adjacent convex portions is represented as Bc, and the height of the prism portion is represented as Tp, the following formula is satisfied $2(Tc-Tp) \leq Bc \leq 10(Tc-Tp)$.

* * * * *